United States Patent
Tonooka

(10) Patent No.: US 6,936,865 B2
(45) Date of Patent: Aug. 30, 2005

(54) VISIBLE LIGHT TRANSMITTING STRUCTURE WITH PHOTOVOLTAIC EFFECT

(75) Inventor: Kazuhiko Tonooka, Ibaraki (JP)

(73) Assignee: National Institute of Advanced Industrial Science and Technology, Ibaraki (JP)

( * ) Notice: Subject to any disclaimer, the term of this patent is extended or adjusted under 35 U.S.C. 154(b) by 0 days.

(21) Appl. No.: 10/817,797

(22) Filed: Apr. 6, 2004

(65) Prior Publication Data

US 2004/0201032 A1 Oct. 14, 2004

(30) Foreign Application Priority Data

Apr. 9, 2003 (JP) ..................................... 2003-105780

(51) Int. Cl.$^7$ ............................................. H01L 33/00
(52) U.S. Cl. ..................... 257/103; 257/77; 257/627; 257/628; 257/194; 438/99
(58) Field of Search ................................. 136/252, 262, 136/265, 256; 257/43, 184, 461, 464, 77, 627, 628, 194; 438/99

(56) References Cited

U.S. PATENT DOCUMENTS 6,403,396 B1 * 6/2002 Gudesen et al. .............. 438/99
6,734,461 B1 * 5/2004 Shiomi et al. ................ 257/77

* cited by examiner

Primary Examiner—David Nelms
Assistant Examiner—Mai-Huong Tran
(74) Attorney, Agent, or Firm—Rader, Fishman & Grauer PLLC

(57) ABSTRACT

A visible light transmitting structure with photovoltaic effect comprises a transparent substrate and a PN junction layer having a P type semiconductor and an N type semiconductor, which is formed on the substrate. The visible light transmitting structure with photovoltaic effect may be used as a windowpane of a house or a business place for shutting out harmful ultraviolet rays by passing visible light through the windowpane.

10 Claims, 3 Drawing Sheets

Picture of Oxide PN Junction

Laminated Structure

VISIBLE LIGHT TRANSMITTING STRUCTURE WITH PHOTOVOLTAIC EFFECT

TECHNICAL FIELD OF THE INVENTION

The present invention relates to a visible light transmitting structure having a function of generating electric power from blue-to-ultraviolet light (photovoltaic effect), and more specifically, to material capable of generating power from blue light-to-ultraviolet light and having most of visible light passing through the material.

DESCRIPTION OF RELATED ART

Conventionally, a solar cell is installed on a roof so as to generate electricity from sunlight efficiently. However, no research was done in terms of generating electric power from blue-ultraviolet light by using a windowpane, and simultaneously having visible light pass through the windowpane.

SUMMARY OF THE INVENTION

It is an object of the present invention to provide a visible light transmitting structure having the function of generating electric power from blue-to-ultraviolet light (photovoltaic effect). The structure may be used as a windowpane of a house or a business place for shutting out harmful ultraviolet rays, simultaneously passing visible light through the windowpane, thereby acquiring brightness and utilizing ultraviolet light for electric power generation.

The object of the present invention can be attained by the visible light transmitting structure having the function of generating electric power from blue-to-ultraviolet light, which comprises an approximately transparent substrate and a PN junction formed on the substrate.

More specifically, the PN junction comprising the P type semiconductor and the N type semiconductor according to the present invention produces carriers (electrons or holes) in the PN junction from the blue-to-ultraviolet lights. The visible light passes through the PN junction made of the P type and N type semiconductors with a 3 eV or more energy band gap.

The ultraviolet light which generates the carriers in the optoelectric cell, occupies about 5% as energy in sunlight, and is harmful since it causes chemical changes to human skins.

Thus, the present invention has at least two advantages of electric power generation and eliminating harmful ultraviolet rays.

DETAILED DESCRIPTION OF THE INVENTION

The present invention will become more apparent from the following detailed description of the embodiments and examples of the present invention.

Figure 1:
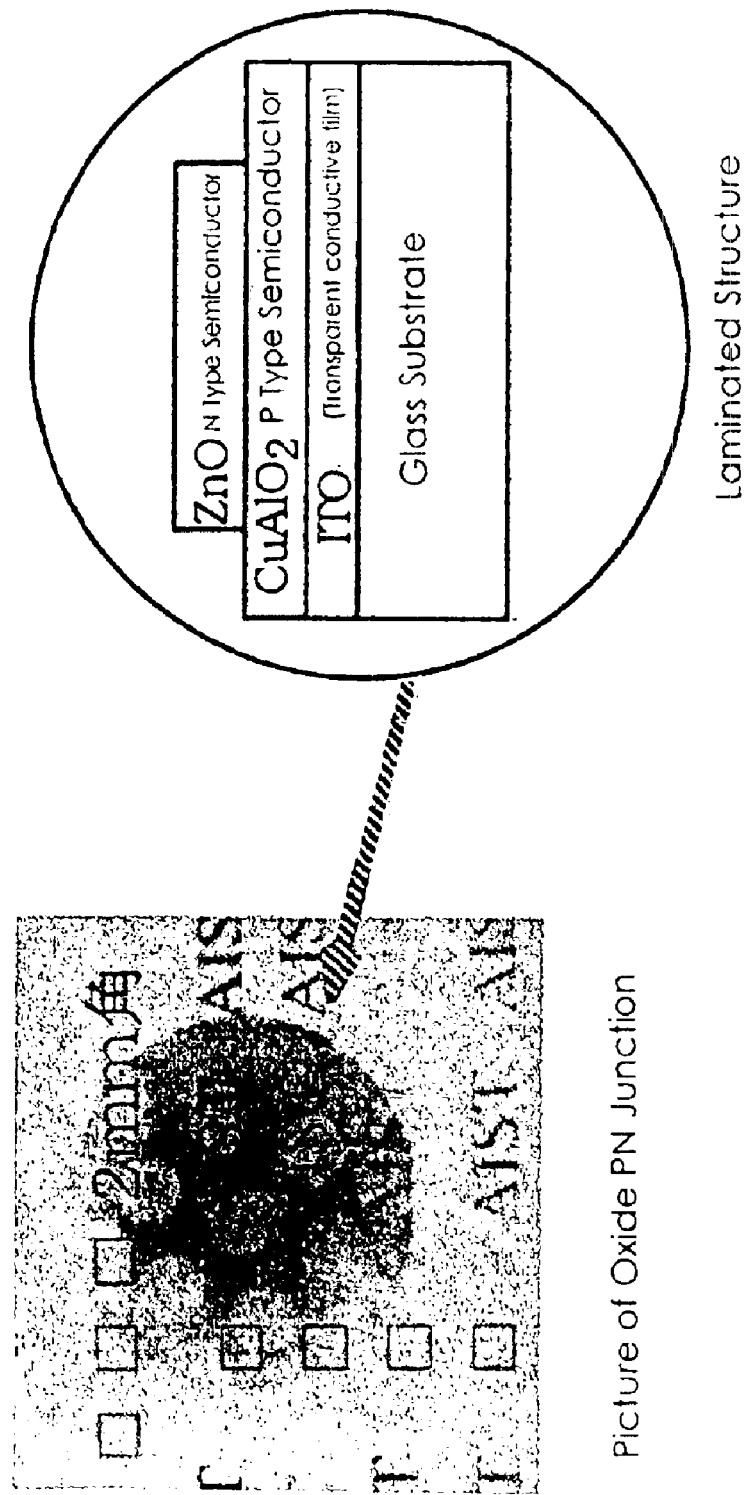
FIG. 1 shows a picture of a visible light transmitting structure and a cross sectional view thereof according to an embodiment of the present invention.

FIG. 1 shows a picture of a visible light transmitting structure and a cross sectional view thereof according to an embodiment of the present invention.

In the sectional view shown in FIG. 1, the visible light transmitting structure comprises an approximately transparent substrate such as a glass substrate and a PN junction formed on the substrate. As shown in the picture shown in FIG. 1, the visible light transmitting structure is placed on a paper sheet on which characters are printed, wherein a certain range of light (from blue to ultraviolet light) irradiates thereon.

Power in semiconductor solar cells is generated due to the photovoltaic effect, which is the effect of generating an electric potential from optical illumination, observed in the PN junctions. The PN junction is where the two layers of semiconductors meet. One of the layers should be the "P-type" (P is short for positive) layer and the other layer the "N-type" (N is short for negative) layer. Thus the PN junction is formed by connecting a P type semiconductor and an N type semiconductor.

This slight difference in electrical characteristics of semiconductors creates an electric field across the PN junction. When this PN junction is exposed to light strong enough to generate photocarries (electrons or holes), the photocarries are accelerated across the PN junction by the electric field formed by the junction. Accordingly, the PN junctions convert optical energy into electric power.

The PN junction used in the present invention produces photocarriers in the PN junction from the blue-to-ultraviolet light. The PN junction made of semiconductors with a 3 eV or more energy bandgap, is used to allow visible light to pass through it.

In addition, in the present invention, an approximately transparent conductive layer can be placed between the transparent substrate and the PN junction layer. An approximately transparent insulating layer can be inserted into the PN junction to form the PIN structure. The transparent conductive layer or the transparent insulating layer functions so as to improve the performance of the PN junction.

As the transparent substrate through which visible light and ultraviolet rays pass, a glass plate, a transparent plastic sheet, or a transparent plastic film is used in the present invention.

Moreover, the transparent conductive layer or the transparent insulating layer can also be used as an outermost layer, in order to reduce internal resistance or to protect such a semiconductor layer.

As the transparent conductive layer (film), tin oxide, indium oxide, indium tin oxide, zinc oxide, titanium oxide, copper aluminum oxide, copper gallium oxide, copper indium oxide, copper chrome oxide, copper scandium oxide, copper yttrium oxide, silver indium oxide, strontium copper oxide, gallium nitride, or compounds thereof can be used.

As the transparent insulating film, transparent ceramics, for example, silicate based glass and PLZT, and further, polyethylene terephthalate, polyvinylidene chloride, polystyrene, methacrylstyrene, polymethylpentene, and polycarbonate can be used.

As the P type semiconductor used in the present invention, copper aluminum oxide, copper gallium oxide, copper indium oxide, copper chrome oxide, copper scandium oxide, copper yttrium oxide, silver indium oxide, strontium copper oxide, zinc oxide or compounds thereof can be used.

Moreover, as the N type semiconductor used in the present invention, tinoxide, indiumoxide, zincoxide, titaniumoxide, copper indium oxide, silver indium oxide, gallium nitride, or compounds thereof can be used.

Furthermore, the thickness of the P type semiconductor layer and the N type semiconductor layer can be adjusted so as to achieve the optimal condition for power generation and optical transmittance.

The characteristics of these semiconductors can be controlled by introducing impurities or vacancies.

Detailed description of an embodiment according to the present invention will be given below. However, the present invention is not limited to these embodiments described below.

As shown in FIG. 1, a 0.1–0.2 micron thick ITO film was formed on the glass substrate by a laser deposition method. Moreover, an about 0.4 micron thick $CuAlO_2$ film (P type semiconductor) was formed on the ITO film. Furthermore, an about 0.4 micron thick ZnO film (n type semiconductor) was formed on the $CuAlO_2$ film.

Although the visible light transmitting structure looked yellowish because of absorption of ultraviolet rays and blue light, characters of the paper sheet under the structure was seen through the structure therefore, the amount of transmitted light was sufficient.

Figure 2:
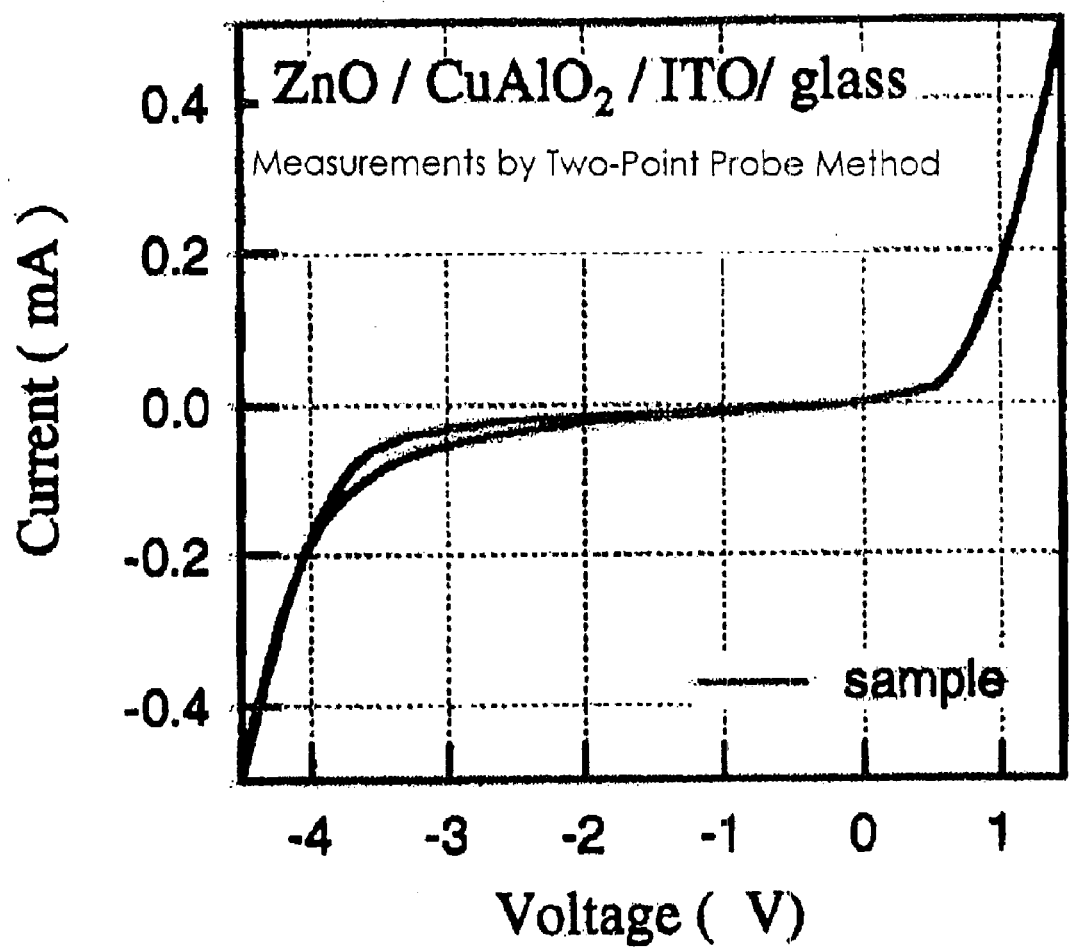
FIG. 2 shows the rectifying characteristic of the visible light transmitting structure according to the present invention.

In case of the PN junction made of the $CuAlO_2$ film (P type semiconductor) and the ZnO film (N type semiconductor), the rectifying characteristic was observed in the current-voltage response. FIG. 2 shows the results measured by a two-point probe method.

Figure 3:
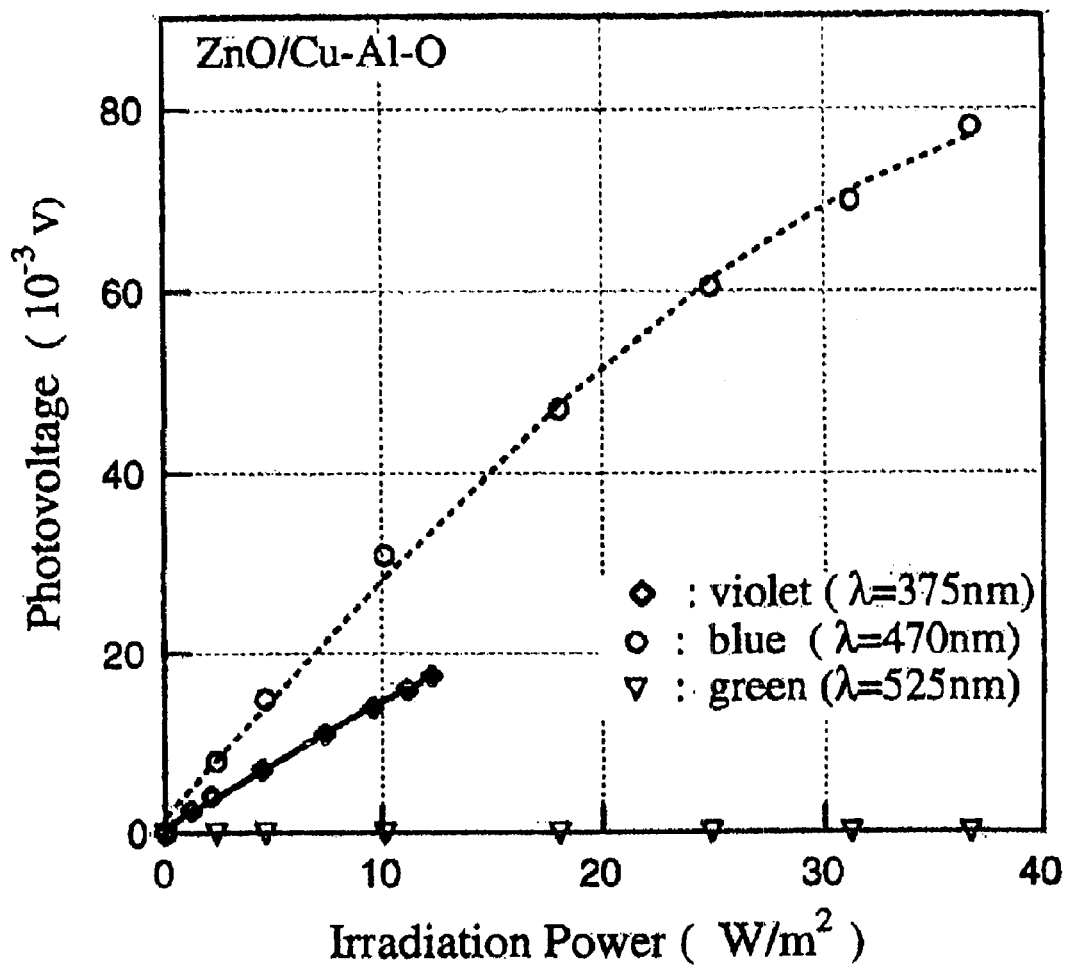
FIG. 3 shows the photovoltaic characteristic of the visible light transmitting structure according to the present invention.

Moreover, the photovoltage of the transparent PN junction was measured under the irradiation of light from violet LED (375 nm), blue LED (470 nm), and green LED (525 nm). The results are shown in FIG. 3.

The results show that the photovoltage was effectively generated by the violet light LED (375 nm).

According to the present invention, it is possible for the structure to generate power using a certain range of light (between blue light to ultraviolet light), and the light passes through the structure.

It turned out that it is specifically effective to sunlight comprising ultraviolet light, visible light and infrared light.

Thus the present invention possesses a number of advantages or purposes, and there is no requirement that every claim directed to that invention be limited to encompass all of them.

The disclosure of Japanese Patent Application No. 2003-105780 filed on Apr. 9, 2003 including specification, drawings and claims is incorporated herein by reference in its entirety.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A visible light transmitting structure having a function of generating electric power from blue-to-ultraviolet light, comprising: an approximately transparent substrate and a PN junction having a P type semiconductor and an N type semiconductor, which is formed on the approximately transparent substrate, wherein the P type semiconductor is made of $CuAlO_2$ and the N type semiconductor is made of ZnO.

2. The visible light transmitting structure according to claim 1, further including a transparent conductive layer placed between the transparent substrate and the PN junction.

3. The visible light transmitting structure according to claim 2, wherein the transparent conductive layer is made of ITO or tin oxide.

4. The visible light transmitting structure according to claim 3, wherein the transparent substrate is in form of glass plate or a film.

5. The visible light transmitting structure according to claim 2, wherein the transparent substrate is in form of glass plate or a film.

6. The visible light transmitting structure according to claim 1, further including a transparent insulating layer inserted in the PN junction to form the PIN structure.

7. The visible light transmitting structure according to claim 6, wherein the transparent substrate is in form of glass plate or a film.

8. The visible light transmitting structure according to claim 1, wherein the transparent substrate is in form of glass plate or a film.

9. A visible light transmitting structure having a function of generating electric power from blue-to-ultraviolet light, comprising: an approximately transparent substrate, a PN junction having a P type semiconductor and an N type semiconductor, which is formed on the approximately transparent substrate, and a transparent conductive layer placed between the transparent substrate and the PN junction, wherein the transparent conductive layer is made of ITO or tin oxide.

10. The visible light transmitting structure according to claim 9, wherein the transparent substrate is in form of glass plate or a film.

* * * * *